(12) United States Patent
Takahashi et al.

(10) Patent No.: US 6,895,564 B2
(45) Date of Patent: May 17, 2005

(54) METHOD FOR DESIGNING LSI SYSTEM

(75) Inventors: Mikawa Takahashi, Kyoto (JP); Hiroshi Mizuno, Osaka (JP); Toshiyuki Moriwaki, Osaka (JP); Hiroki Shinde, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/078,469

(22) Filed: Feb. 21, 2002

(65) Prior Publication Data

US 2003/0159117 A1 Aug. 21, 2003

(51) Int. Cl.⁷ .............................................. G06F 17/50
(52) U.S. Cl. ................................. 716/4; 716/5; 716/6
(58) Field of Search ............................... 716/4, 5, 6, 1; 257/347; 326/80

(56) References Cited

U.S. PATENT DOCUMENTS

| | | | |
|---|---|---|---|
| 4,558,234 A | * 12/1985 | Suzuki et al. | 326/110 |
| 5,831,864 A | 11/1998 | Raghunathan et al. | 364/488 |
| 6,043,536 A | * 3/2000 | Numata et al. | 257/347 |
| 6,433,584 B1 | * 8/2002 | Hatae | 326/80 |

OTHER PUBLICATIONS

Han et al., "Gate Leakage Current Simulation by Boltzmann Transport Equation and ilts Dependence on the Gate Oxide Thickness", Sep. 1999, IEEE International Conference on SISPAD, pp. 247–250.*

Ferre et al., "Characterization of Leakage Power in CMOS Technologies", Sep. 1998, IEEE International Conference on Electronic, Circuits and Systems, Paper, vol. 2, pp. 185–188.*

Wang et al., "An Investigation of Power Delay Trade–Offs for Dual Vt CMOS Circuits", Oct. 1999, IEEE International Conference on Computer Design, Paper, pp. 556–562.*

Bowman et al., "A Circuit–Level Perspective of the Optimum Gate Oxide Thickness", Aug. 2001, IEEE Transactions on Electronic Devices, pp. 1800–1810.*

"From Miniaturization to Total Skill, Reconstruction of CMOS Strategy . . . ", Nikkei Microdevices, pp. 118–121, Aug. 2000 (partial English translation).

* cited by examiner

Primary Examiner—Vuthe Siek
Assistant Examiner—Sun James Lin
(74) Attorney, Agent, or Firm—McDermott Will & Emery LLP

(57) ABSTRACT

A design technique considering a peak current is provided for high-level design of systems including LSIs. A hardware model representing the trade-off relationship between a leak current and performance is prepared in advance for functional units constituting the system. In the hardware model, the relationship between performance tpd and a source-drain leak current Pleak is described with a threshold voltage Vth as a parameter, for example. By referring to the trade-off relationship, design conditions for the functional units are determined under evaluation of the performance and power consumption of the entire system.

10 Claims, 9 Drawing Sheets

| Functional unit D | Processing time | Power consumption due to leak current |
|---|---|---|
| Soft | 6.0 | 6.0 |
| Hard D1 | 4.5 | 13.5 |
| Hard D2 | 5.0 | 7.5 |

|       | D1  | D2  |
|-------|-----|-----|
| Vth   | 0.5 | 0.3 |
| tpd   | 0.5 | 1   |
| Pleak | 2   | 0.5 |

FIG. 6

| Functional unit D | Processing time | Power consumption due to leak current |
|---|---|---|
| Soft | 6.0 | 6.0 |
| Hard D1 | 4.5 | 13.5 |
| Hard D2 | 5.0 | 7.5 |

|         | D1  | D2  |
|---------|-----|-----|
| VDD     | 5   | 3   |
| tpd     | 0.5 | 1   |
| Pg_leak | 2   | 0.5 |

|  | D1 | D2 |
|---|---|---|
| Tox | 0.1 | 1 |
| tpd | 0.5 | 1 |
| Pg_leak | 2 | 0.5 |

METHOD FOR DESIGNING LSI SYSTEM

BACKGROUND OF THE INVENTION

The present invention relates to a technology on so-called upstream design for systems including large-scale integrated circuits (LSIs).

Complementary metal-oxide semiconductor (CMOS) LSIs, which were first commercialized three decades ago and have made up the majority of the market for more than a decade, now face a decisive turning point. LSI manufacturers have hitherto shaped strategies on LSIs by only concentrating on scale-down of LSIs. However, at last, it has become difficult to attain both higher speed and lower power of CMOS LSIs simultaneously by only achieving scale-down thereof (see "From scale-down to all-around ability; Reshaping of CMOS strategy", Nikkei Microdevices, August 2000, pp. 118–121).

One of problems causing difficulty in attaining both higher speed and lower power simultaneously is a leak current.

More specifically, as a gate oxide film is made thinner with the advance in scale-down of an LSI, a gate leak current increases so greatly that requirements of an application apparatus fail to be satisfied. For example, in the generation of devices having a gate oxide film as thin as 2 to 2.5 nm conforming to the 0.15 ìm rule, the tunnel current allowed to flow through the gate oxide film exceeds a standby current value of the order of several ìA required for a mobile apparatus. If it is attempted to suppress the standby current to conform to the requirements of the application apparatus, further thinning of the gate oxide film, which is essential for attaining higher speed, will no more be obtained. This indicates that attainment of both higher speed and lower power simultaneously becomes very difficult.

SUMMARY OF THE INVENTION

An object of the present invention is providing a design technique considering a peak current for high-level design of systems including LSIs.

More specifically, the present invention is directed to a method for designing a system including an LSI at a system design level. The method comprises the step of determining design conditions for respective functional units constituting the system under evaluation of performance and power consumption of the entire system, wherein the step of determining design conditions comprises the steps of: preparing in advance a hardware model representing the trade-off relationship between a leak current and performance for at least one of the functional units; and determining design conditions for the functional units by referring to the trade-off relationship represented by the hardware model.

The design conditions preferably include at least one of a supply voltage, a threshold voltage, and the thickness of a gate insulating film.

The hardware model preferably comprises a hardware model in which the relationship between leak power caused by a source-drain leak current and the performance is described with a threshold voltage as a parameter, a hardware model in which the relationship between leak power caused by a gate leak current and the performance is described with a supply voltage as a parameter, or a hardware model in which the relationship between leak power caused by a gate leak current and the performance is described with the thickness of a gate insulating film as a parameter.

BRIEF DESCRIPTION OF THE DRAWINGS

FIG. 6 is a table providing a summary of the evaluation results in FIGS. 3A to 5C.

DESCRIPTION OF THE PREFERRED EMBODIMENTS

Hereinafter, an embodiment of the present invention will be described with reference to the accompanying drawings.

In this embodiment, it is assumed that design at a high level called a system design level is performed for a system including an LSI. Here, a design technique called hardware-software co-design is employed. The "hardware-software co-design" refers to a type of design allowing mixture of hardware and software in a same system. More specifically, the design includes the following procedure. First, under the assumption that all of functional units constituting an LSI system are implemented by software using a CPU, the processing time required for the entire system is evaluated. The functional units are then replaced with hardware devices one by one properly so that the processing time satisfies predetermined specifications.

Figure 1:
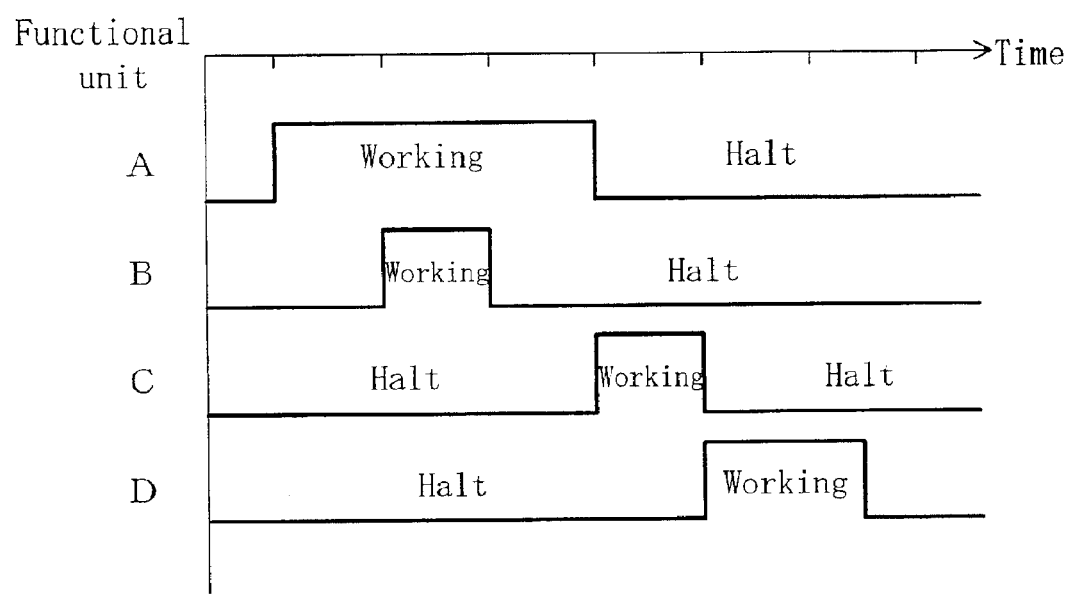
FIG. 1 is an operation chart schematically showing the operations of functional units constituting an LSI system as an object to be designed in an embodiment of the present invention.

FIG. 1 is an operation chart schematically showing the operations of the functional units constituting the LSI system as an object to be designed. The functional units, A, B, C, and D, of the LSI system operate at the timing shown in FIG. 1.

In this embodiment, a hardware model representing the trade-off relationship between a leak current and performance is prepared for the functional unit D.

Figures 2A, 2B:
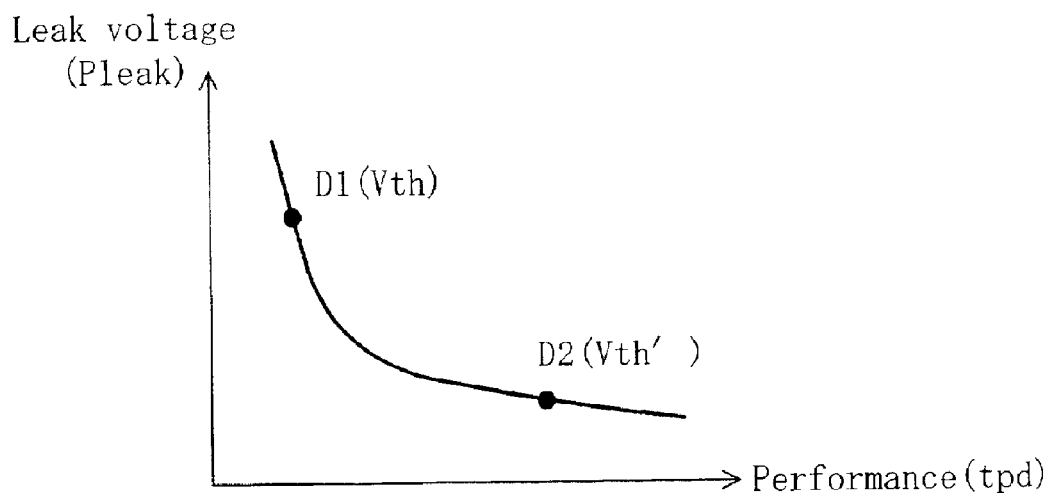
FIGS. 2A and 2B are views showing an exemplary hardware model for the functional unit D.

FIGS. 2A and 2B show an exemplary hardware model for the functional unit D. The table data shown in FIG. 2A, in which the relationship between leak power Pleak caused by a source-drain leak current and performance (delay) tpd is described with a threshold voltage Vth as a parameter, is prepared as the hardware model for the functional unit D. Here, it is assumed that the supply voltage and the thickness of an oxide film are constant predetermined values.

In general, the performance tpd and the leak power Pleak are represented by the following expressions.

$$tpd = k \cdot C \times \frac{VDD}{(VDD - Vth)^2} \quad (1)$$

$$Pleak = VDD \times Ileak = m \cdot \exp\left(\frac{-Vth}{S/ln10}\right) \times VDD$$

where VDD is the supply voltage, C is the capacitance, k and m are constants, and s is a square constant. From the above expressions, it is found that with change of the value of the threshold voltage Vth, the performance tpd and the leak power Pleak change along a curve as shown in FIG. 2B.

Hereinafter, the method for designing an LSI system of this embodiment will be described with reference to FIGS. 3A to 5C.

Figure 3A:
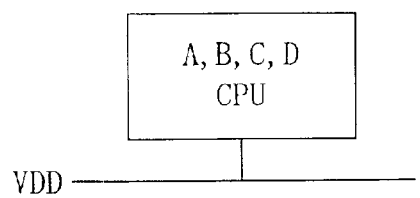
FIGS. 3A, 3B and 3C are views showing evaluation results obtained when all of the functional units are implemented by software.
Figure 3B:
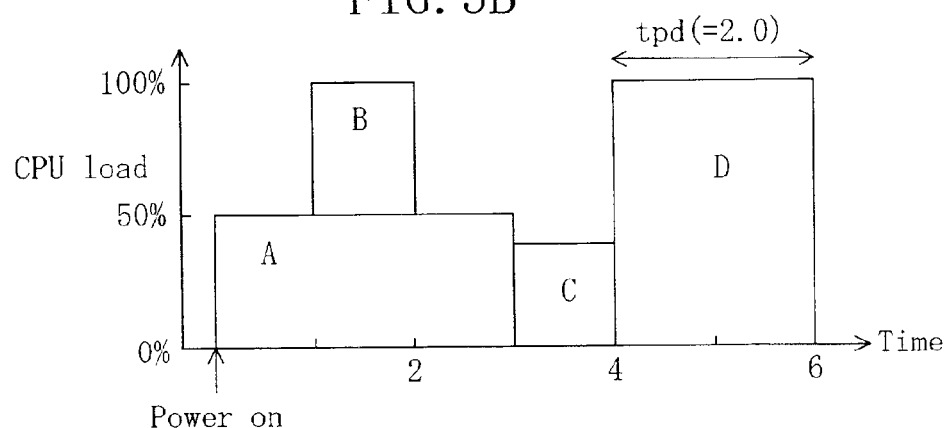
Figure 3C:
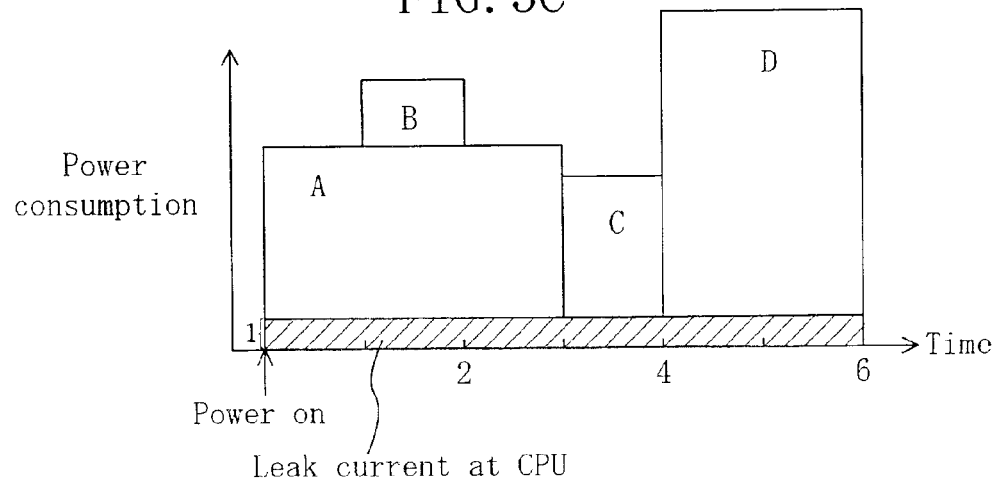

First, as shown in FIG. 3A, it is assumed that all of the functional units A, B, C, and D constituting the system are implemented by software. FIGS. 3B and 3C show the evaluation results of the CPU load and power consumption, respectively, required in this implementation. In this implementation, the processing time is "6.0" as shown in FIG. 3B, and the amount of power consumption due to a leak current at the CPU is "6.0" (=1×6) as shown in FIG. 3C.

Figure 4A:
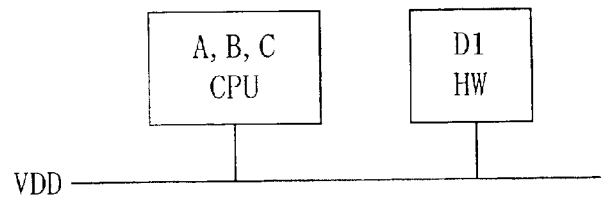
FIGS. 4A, 4B and 4C are views showing evaluation results obtained when the functional unit D is implemented by hardware D1.
Figure 4B:
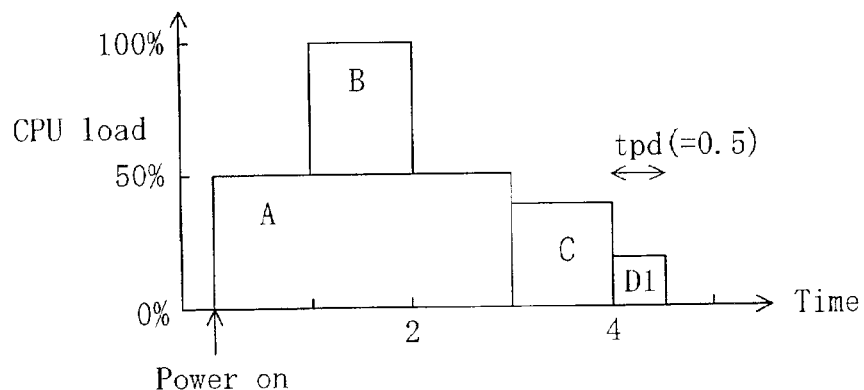
Figure 4C:
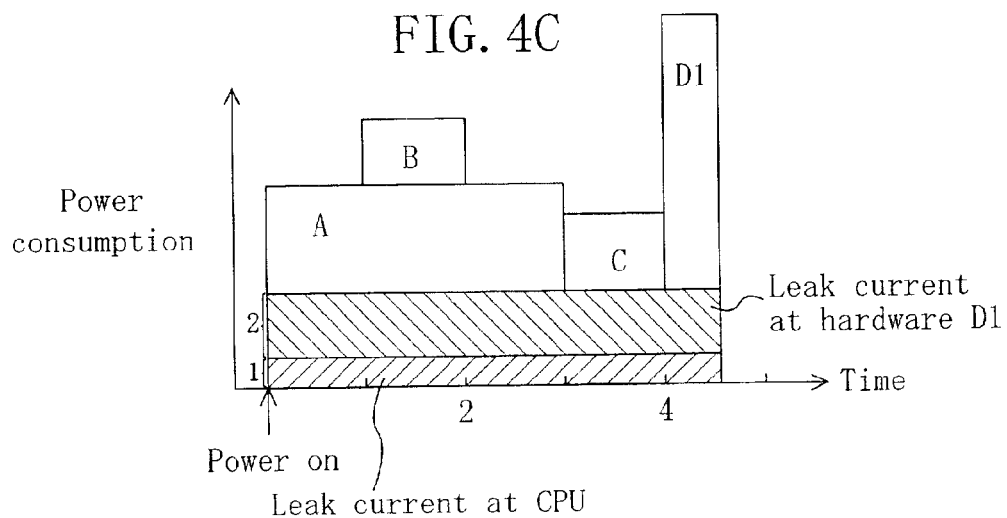

Next, it is assumed that only the functional unit D is implemented by hardware D1 as shown in FIG. 4A. FIGS. 4B and 4C show the evaluation results of the CPU load and power consumption, respectively, required in this implementation. In this implementation, as shown in FIG. 4B, the processing time tpd for the functional unit D is reduced from "2.0" to "0.5", resulting in the total processing time for the entire system of "4.5". On the contrary, as shown in FIG. 4C, power consumption is additionally generated due to a leak current at the functional unit D. As a result, the total amount of power consumption due to leak currents is "13.5" (=(1+2)×4.5) including that due to the leak current at the CPU.

Figure 5A:
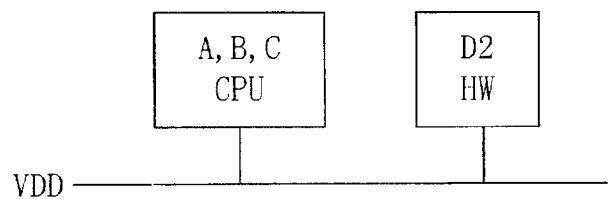
FIGS. 5A, 5B and 5C are views showing evaluation results obtained when the functional unit D is implemented by hardware D2.
Figure 5B:
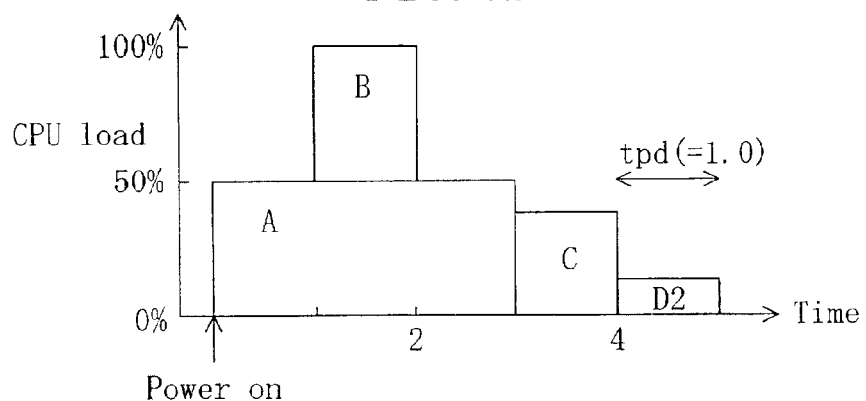
Figure 5C:
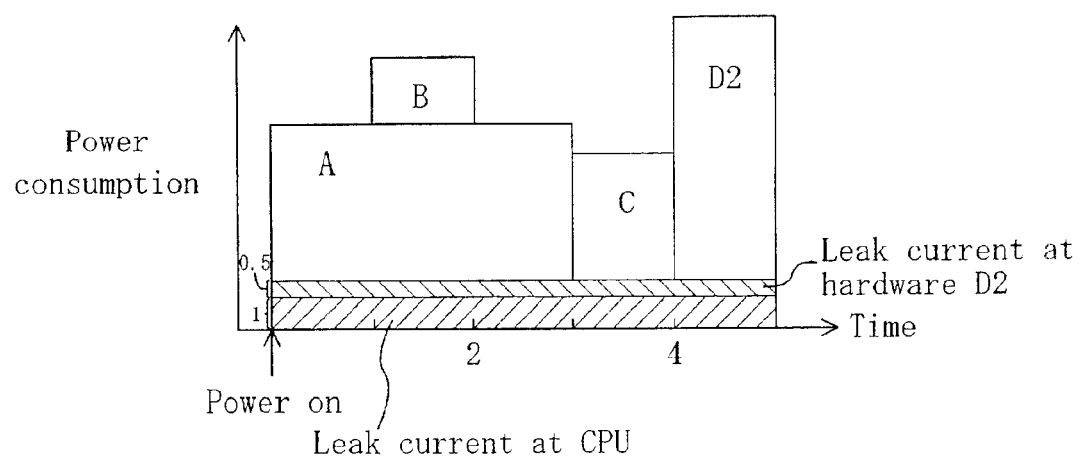

Further, it is assumed that only the functional unit D is implemented by hardware D2 as shown in FIG. 5A. FIGS. 5B and 5C show the evaluation results of the CPU load and power consumption, respectively, required in this implementation. In this implementation, as shown in FIG. 5B, the processing time tpd for the functional unit D is "1.0", resulting in the total processing time for the entire system of "5.0". As shown in FIG. 5C, the total amount of power consumption due to leak currents is "7.5" (=(1+0.5)×5) including that due to the leak current at the CPU.

FIG. 6 is a table summarizing the evaluation results described above. As is found from FIG. 6, when the functional unit D is implemented by software, the power consumption due to leak currents is small, but the processing time is long. On the contrary, when the functional unit D is implemented by the hardware D1, the processing time is shortest, but the power consumption due to leak currents is largest. When the functional unit D is implemented by the hardware D2, the processing time can be shortened without increasing the power consumption due to leak currents so greatly, compared with the case of implementation by software. By referring to evaluation results as shown in FIG. 6, it is possible to select the way to implement the functional unit D and the design conditions (the threshold voltage Vth in the illustrated example) depending on the use and function of the LSI system to be designed.

Figure 7A:
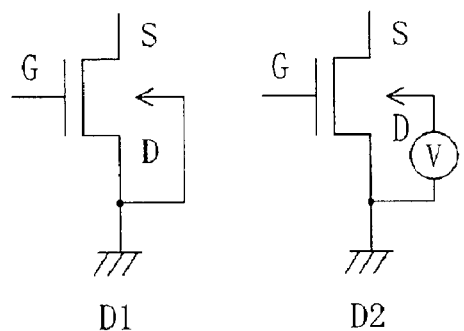
FIGS. 7A, 7B, and 7C are views showing how to implement the hardware model in FIGS. 2A and 2B.
Figure 7B:
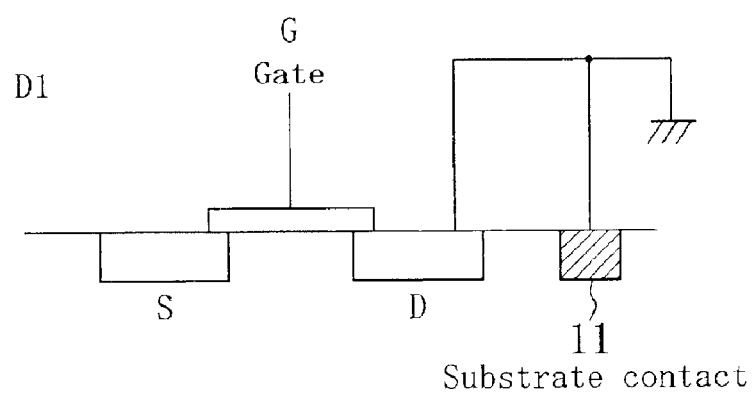
Figure 7C:
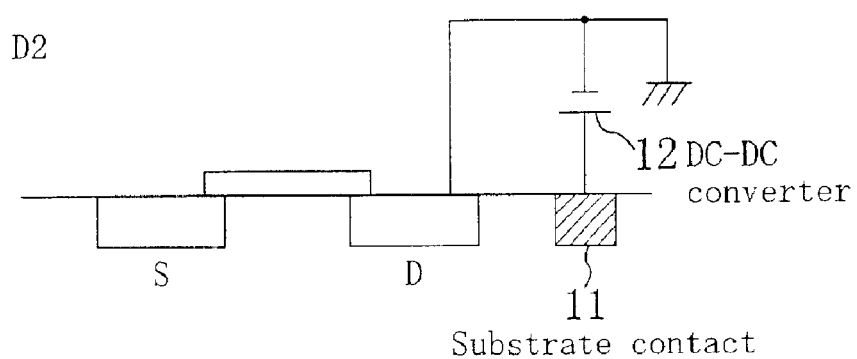

The threshold voltage Vth as shown in FIGS. 2A and 2B can be easily set by a general threshold voltage control technique such as VTCMOS. FIG. 7A shows circuit diagrams of transistors corresponding to the hardware D1 and D2. A threshold voltage Vth different from that for the hardware D1 can be set for the hardware D2 by applying a bias voltage to a substrate potential. FIGS. 7B and 7C conceptually illustrate the structures of the transistors corresponding to the hardware D1 and D2, respectively. In the structure of FIG. 7B, the source of the transistor is directly connected to a substrate contact 11, while in the structure of FIG. 7C, the source of the transistor is connected to the substrate contact 11 via a DC—DC converter 12.

Although a source-drain leak current was considered as the leak current in the illustrated example, a gate leak current may also be considered as the leak current.

In general, the performance tpd and the gate leak current Igleak are represented by the following expressions.

$$tpd = n \times Tox \times Cload \times VDD/(VDD-Vth)^2 \, Ig\_leak = (VDD/Tox)^2 \times \exp(-A \times Tox/VDD) \quad (2)$$

where A and n are constants, VDD is the supply voltage, and Tox is the thickness of a gate insulating film. As is found from these expressions, the relationship between the gate leak current Igleak and the performance tpd can be described with the supply voltage VDD as a parameter. The relationship can also be described with the thickness of the gate insulating film Tox as a parameter. That is, for the gate leak current, hardware models as shown in FIGS. 8A and 8B and FIGS. 9A and 9B can be prepared.

Figures 8A, 8B:
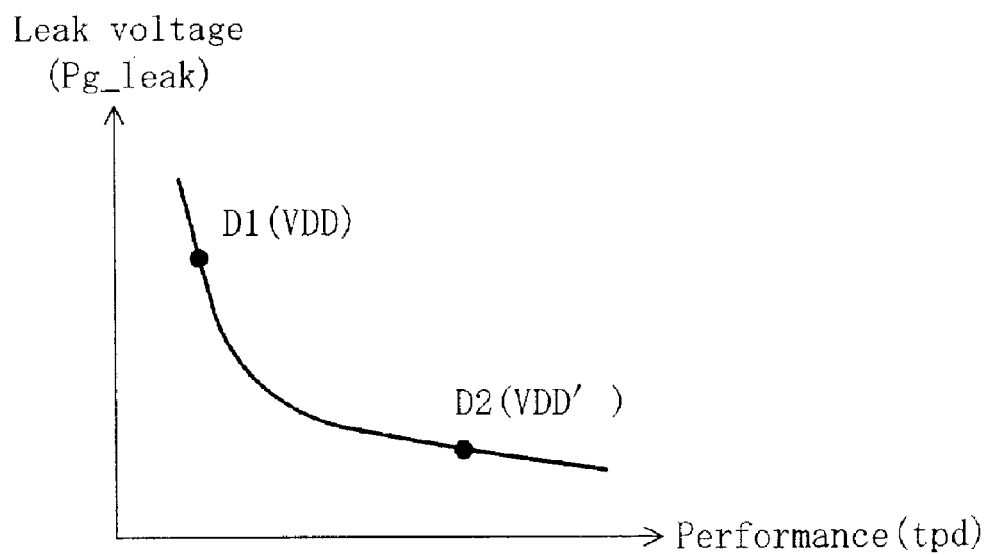
FIGS. 8A and 8B are views showing an exemplary hardware model considering a gate leak current, where the supply voltage is used as a parameter.

FIG. 8A shows table data in which the relationship between leak power Pgleak caused by the gate leak current and the performance tpd is described with the supply voltage VDD as a parameter. Here, it is assumed that the threshold voltage Vth and the thickness of the gate insulating film Tox are constant predetermined values. With change of the value of the supply voltage VDD, the performance tpd and the leak power Pgleak change along a curve as shown in FIG. 8B.

Figures 9A, 9B:
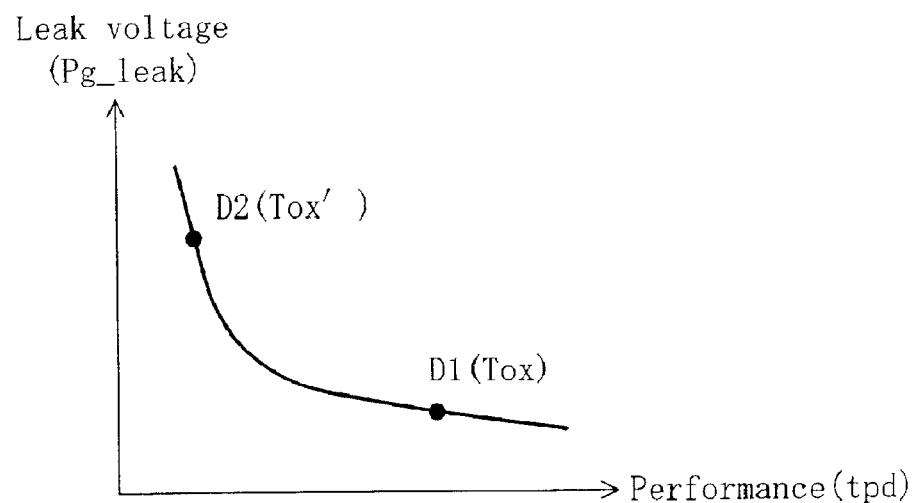
FIGS. 9A and 9B are views showing an exemplary hardware model considering a gate leak current, where the thickness of a gate insulating film is used as a parameter.

FIG. 9A shows table data in which the relationship between the leak power Pgleak caused by the gate leak current and the performance tpd is described with the thickness of the gate insulating film Tox as a parameter. Here, it is assumed that the supply voltage VDD and the threshold voltage Vth are constant predetermined values. With change of the thickness of the gate insulating film Tox, the performance tpd and the leak power Pgleak change along a curve as shown in FIG. 9B.

By performing system design in a manner as described above using a hardware model as shown in FIGS. 8A and 8B or FIGS. 9A and 9C, high-level design considering a gate leak current is possible.

The method for designing an LSI system of the embodiment of the present invention can be implemented by an apparatus provided with a computer capable of executing a program for implementing the method. It is also possible to implement the method by recording the program for implementing the method on a computer-readable recording medium and allowing the computer to execute the program recorded on the recording medium.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for designing a system including an LSI at a system design level, the method comprising the step of:

determining design conditions for respective functional units constituting the system under evaluation of processing time and power consumption of the entire system, wherein the step of determining design conditions comprises the steps of:

implementing the functional units constituting the system by software to evaluate the processing time and power consumption of the entire system;

preparing in advance a hardware model representing a trade-off relationship between a leak current and a processing time for at least one of the functional units;

implementing said at least one of the functional units by hardware to evaluate the processing time and power consumption of the entire system; and determining the design conditions for said at least one of the functional units by referring to the trade-off relationship represented by the hardware model so that the processing time of the entire system satisfies at least one predetermined specification.

2. The method of claim 1, wherein the design conditions include at least one of a supply voltage, a threshold voltage, and the thickness of a gate insulating film.

3. The method of claim 1, wherein the hardware model comprises a hardware model in which the relationship between leak power caused by a source-drain leak current and the processing time is described with a threshold voltage as a parameter.

4. The method of claim 1, wherein the hardware model comprises a hardware model in which the relationship between leak power caused by a gate leak current and the processing time is described with a supply voltage as a parameter.

5. The method of claim 1, wherein the hardware model comprises a hardware model in which the relationship between leak power caused by a gate leak current and the processing time is described with the thickness of a gate insulating film as a parameter.

6. An apparatus for designing a system including an LSI at a system design level, the apparatus comprising:

means for determining design conditions for respective functional units constituting the system under evaluation of processing time and power consumption of the entire system, wherein the means for determining design conditions implements the functional units constituting the system by software to evaluate the processing time and power consumption of the entire system, uses a hardware model, prepared in advance, representing a trade-off relationship between a leak current and processing time for at least one of the functional units, implements said at least one of the functional units by hardware to evaluate the processing time and power consumption of the entire system, and determines the design conditions for said at least one of the functional units by referring to the trade-off relationship represented by the hardware model so that the processing time of the entire system satisfies at least one predetermined specification.

7. A recording medium with a program for designing a system including an LSI at a system design level recorded thereon, the program comprising the step of:

determining design conditions for respective functional units constituting the system under evaluation of processing time and power consumption of the entire system, wherein the step of determining design conditions comprises the steps of:

implementing the functional units constituting the system by software to evaluate the processing time and power consumption of the entire system, using a hardware model, prepared in advance, representing a trade-off relationship between a leak current and a processing time for at least one of the functional units, implementing said at least one of the functional units by hardware to evaluate the processing time and power consumption of the entire system, and determining the design conditions for said at least one of the functional units by referring to the trade-off relationship represented by the hardware model so that the processing time of the entire system satisfies at least one predetermined specification.

8. A method for designing a system including an LSI, the LSI including a plurality of functional units, said method comprising the steps of:

implementing the functional units constituting the system by software to evaluate the processing time and power consumption of the entire system;

preparing a plurality of hardware models for the plurality of functional units, respectively, each hardware model describing a leak current and a processing time of the corresponding functional unit with a design condition as a parameter;

evaluating processing time and power consumption of the entire system using at least one of the plurality of hardware models in view of a trade-off relationship between the leak current and the processing time; and determining a design condition for at least one of the plurality of functional units based on a result of the evaluating step so that the processing time of the entire system satisfies at least one predetermined specification.

9. The method of claim 8, wherein at least one of the plurality of hardware models includes table data which describes the leak current and the processing time with the design condition as a parameter.

10. The method of claim 8, wherein the result of the evaluating step includes table data which describes the processing time and power consumption of the entire system as a design condition of at least one of the plurality of functional units.

* * * * *

UNITED STATES PATENT AND TRADEMARK OFFICE
CERTIFICATE OF CORRECTION

PATENT NO. : 6,895,564 B2  
DATED : May 17, 2005  
INVENTOR(S) : Miwaka Takahashi et al.

Page 1 of 1

It is certified that error appears in the above-identified patent and that said Letters Patent is hereby corrected as shown below:

<u>Title page,</u>  
Item [75], Inventors, change "Mikawa" to -- Miwaka --.

Signed and Sealed this

Sixteenth Day of August, 2005

JON W. DUDAS  
*Director of the United States Patent and Trademark Office*